(12) United States Patent
Fujishiro et al.

(10) Patent No.: US 10,716,250 B2
(45) Date of Patent: Jul. 14, 2020

(54) COMPONENT MOUNTING APPARATUS

(71) Applicant: FUJI CORPORATION, Chiryu-shi (JP)

(72) Inventors: Takeshi Fujishiro, Toyohashi (JP); Koji Kawaguchi, Kasugai (JP); Mitsuru Sanji, Toyota (JP); Kohei Sugihara, Nishio (JP)

(73) Assignee: FUJI CORPORATION, Chiryu-shi (JP)

( * ) Notice: Subject to any disclaimer, the term of this patent is extended or adjusted under 35 U.S.C. 154(b) by 284 days.

(21) Appl. No.: 15/753,044

(22) PCT Filed: Aug. 20, 2015

(86) PCT No.: PCT/JP2015/073338
§ 371 (c)(1),
(2) Date: Feb. 15, 2018

(87) PCT Pub. No.: WO2017/029750
PCT Pub. Date: Feb. 23, 2017

(65) Prior Publication Data
US 2018/0368296 A1 Dec. 20, 2018

(51) Int. Cl.
*B23P 19/00* (2006.01)
*H05K 13/04* (2006.01)
*H05K 13/08* (2006.01)

(52) U.S. Cl.
CPC ..... *H05K 13/0413* (2013.01); *H05K 13/0409* (2018.08); *H05K 13/082* (2018.08); *H05K 13/0882* (2018.08)

(58) Field of Classification Search
CPC ............ H05K 13/0417; H05K 13/04
See application file for complete search history.

(56) References Cited

U.S. PATENT DOCUMENTS 4,610,083 A * 9/1986 Campisi ............... H05K 13/08
29/832
6,158,117 A 12/2000 Mimura et al.
(Continued)

FOREIGN PATENT DOCUMENTS

EP 0 886 465 A1 12/1998
JP 2008-41712 A 2/2008
(Continued)

OTHER PUBLICATIONS

Extended European Search Report dated Jul. 6, 2018 in European Patent Application No. 15901732.6, 9 pages.
(Continued)

*Primary Examiner* — Paul D Kim
(74) *Attorney, Agent, or Firm* — Oblon, McClelland, Maier & Neustadt, L.L.P.

(57) ABSTRACT

A component mounting apparatus is provided with a controller that controls a mounting head. The mounting head is provided with a nozzle holder, a nozzle that is elastically supported to be movable up and down with respect to the nozzle holder, a flange that is provided at a position that is offset from the central axis of the nozzle, and a second engaging section that is able to move the nozzle downward by engaging with the flange and pressing down the flange against the elastic force of a nozzle spring. The controller measures in advance the deviation amount of the tip position of the nozzle between before and after the second engaging section moves the nozzle downward and controls the mounting head so as to suck the component and mount the component on the board taking the deviation amount into account.

5 Claims, 8 Drawing Sheets

(56) References Cited

U.S. PATENT DOCUMENTS

| | | | |
|---|---|---|---|
| 6,263,559 B1 | 7/2001 | Mimura et al. | |
| 6,626,222 B1 * | 9/2003 | VanNortwick | B65H 35/0013 |
| | | | 156/261 |
| 6,694,606 B1 * | 2/2004 | Ohashi | H05K 13/0417 |
| | | | 29/740 |
| 6,817,216 B2 * | 11/2004 | Kou | H05K 13/0417 |
| | | | 70/225 |
| 7,273,166 B2 * | 9/2007 | Suhara | H05K 13/084 |
| | | | 235/376 |
| 8,269,973 B2 * | 9/2012 | Kou | B65H 26/02 |
| | | | 356/445 |
| 9,271,417 B2 * | 2/2016 | Kawaguchi | H05K 13/0417 |
| 9,832,919 B2 * | 11/2017 | Kawaguchi | H05K 13/0413 |
| 2015/0045938 A1 * | 2/2015 | Kawaguchi | H05K 13/0417 |
| | | | 700/122 |
| 2015/0083845 A1 * | 3/2015 | Kawaguchi | H05K 13/0419 |
| | | | 242/563 |
| 2015/0282398 A1 | 10/2015 | Kawaguchi | |

FOREIGN PATENT DOCUMENTS

| | | |
|---|---|---|
| WO | WO 2014/080472 A1 | 5/2014 |
| WO | WO 2015/059839 A1 | 4/2015 |

OTHER PUBLICATIONS

International Search Report dated Nov. 17, 2015, in PCT/JP2015/073338 filed Aug. 20, 2015.

* cited by examiner

COMPONENT MOUNTING APPARATUS

TECHNICAL FIELD

The present application relates to a component mounting apparatus.

BACKGROUND ART

In the related art, a component mounting apparatus is known that mounts a component, which is supplied from a component supply device, at a predetermined position of a board. Ordinarily, the component mounting apparatus is provided with a control device that controls a mounting head. For example, in a component mounting apparatus that is described in PTL 1, a mounting head is provided with a nozzle holder that extends in an up-down direction, a nozzle with a flange that is attached to the nozzle holder on a lower end of the nozzle holder to be movable up and down with respect to the nozzle holder, a spring that elastically supports the nozzle, and a nozzle lifting and lowering mechanism that is able to move the nozzle downward by pressing down the flange of the nozzle against elastic force of a spring. In addition, for example, the control device controls the nozzle lifting and lowering mechanism such that the component has no damage due to an impact of a nozzle contacting the component when the nozzle sucks the component that is supplied from the component supply device. That is, the control device controls the nozzle lifting and lowering mechanism such that the nozzle is disposed above the component in a state in which the nozzle is pressed downward by the nozzle lifting and lowering mechanism, and such that thereafter, the nozzle holder is lowered and the leading end of the nozzle is caused to contact the component, but reaction force at that time is made equal to a set pressing force.

CITATION LIST

Patent Literature

PTL 1: WO2014/080472

SUMMARY

Technical Problem

However, in such a component mounting apparatus, a nozzle tip position before a nozzle lifting and lowering mechanism presses down a flange of the nozzle and a nozzle tip position after a nozzle lifting and lowering mechanism presses down a flange of the nozzle may deviate. This is because a moment of force is generated due to pressing down a position that is deviated from the central axis of the nozzle when the flange of the nozzle is pressed down by the nozzle lifting and lowering mechanism, and the pressed down nozzle is inclined with respect to the central axis. When such deviation is generated, it is difficult to stabilize positioning accuracy of the nozzle tip for sucking and mounting the component.

In order to solve the problem, the present disclosure has the main object of increasing suction position accuracy and mounting position accuracy in a case where a nozzle is pressed down at a position that is offset from the central axis of the nozzle and a component is sucked by the nozzle tip and the component that is sucked by the nozzle tip is mounted on a board.

Solution to Problem

A component mounting apparatus according to the present disclosure includes: a mounting head; and a control device that controls the mounting head, in which the mounting head includes a nozzle holder that extends in an up-down direction, a nozzle that is attached to a lower end of the nozzle holder to be movable up and down with respect to the nozzle holder, an elastic body that elastically supports the nozzle, a protrusion that is provided at a position that is offset from the central axis of the nozzle, and a nozzle lifting and lowering mechanism that is able to move the nozzle downward by engaging with the protrusion and pressing down the protrusion against elastic force of the elastic body, and in which the control device measures in advance a deviation amount between a tip position of the nozzle before the nozzle lifting and lowering mechanism moves the nozzle downward and a tip position of the nozzle after the nozzle lifting and lowering mechanism moves the nozzle downward, and controls the mounting head so as to suck a component to mount the component on a board taking the deviation amount into account.

The component mounting apparatus measures in advance the deviation amount between the tip position of the nozzle before the nozzle lifting and lowering mechanism moves the nozzle downward and the tip position of the nozzle after the nozzle lifting and lowering mechanism moves the nozzle downward, and controls the mounting head so as to suck the component and mount the component on the board taking the deviation amount into account. Therefore, it is possible to increase suction position accuracy and mounting position accuracy in a case where a position that is offset from the central axis of the nozzle is pressed down and the component is sucked by the nozzle leading end and the component that is sucked by the nozzle tip is mounted on the board.

In the component mounting apparatus of the present disclosure, the control device may measure the deviation amount each time the nozzle is exchanged. Consequently, even if the nozzle is exchanged with a different nozzle, it is possible to increase suction position accuracy and mounting position accuracy because it is controlled so that the mounting head sucks the component and mounts the component on the board taking the deviation amount into account matching the nozzle after the exchange. Note that, the "nozzle is exchanged" has a meaning including not only a case where the nozzle itself is exchanged, but also a case where a part of the nozzle is exchanged.

In the component mounting apparatus of the present disclosure, the control device may measure in advance the deviation amount in a case where the nozzle lifting and lowering mechanism presses down a predetermined reference position of the protrusion and a case where the nozzle lifting and lowering mechanism presses down one or more rotation angle positions that are different from the reference position, determine the deviation amount according to an angle from the reference position to a position at which the protrusion is pressed down by the nozzle lifting and lowering mechanism when the nozzle actually sucks or mounts the component from the measured deviation amounts, and control the mounting head so as to suck the component and mount the component on the board taking the determined deviation amount into account. Consequently, even if the deviation amount with a different moment of force that is generated in the nozzle is varied according to the angle from the reference position to the position at which the nozzle lifting and lowering mechanism presses down the protrusion, it is possible to take into account an appropriate deviation amount according to the angle.

In the component mounting apparatus of the present disclosure that controls taking the deviation amount into account according to such an angle, the nozzle holder may have a pin that is bridged to the lower end of the nozzle holder in a diametrical direction of the nozzle holder, the nozzle may have a pair of guide portions formed of a long groove or a long hole that extends in the up-down direction, the pin may pass through the pair of guide sections and guide movement of the nozzle in the up-down direction, and the control device may set a position on the protrusion on a line corresponding to a line along which the pin extends as the reference position. In many cases the deviation amount of the position on the extension line of the pin and the deviation amount of another position do not match, but even in such a case, it is possible to increase accuracy because the appropriate deviation amount is determined according to the angle from the reference position to a position at which the nozzle lifting and lowering mechanism presses down the protrusion.

BRIEF DESCRIPTION OF DRAWINGS

FIG. 5(a) illustrates a state before lowering, and FIG. 5(b) illustrates a state after lowering.

DESCRIPTION OF EMBODIMENTS

Figure 1:
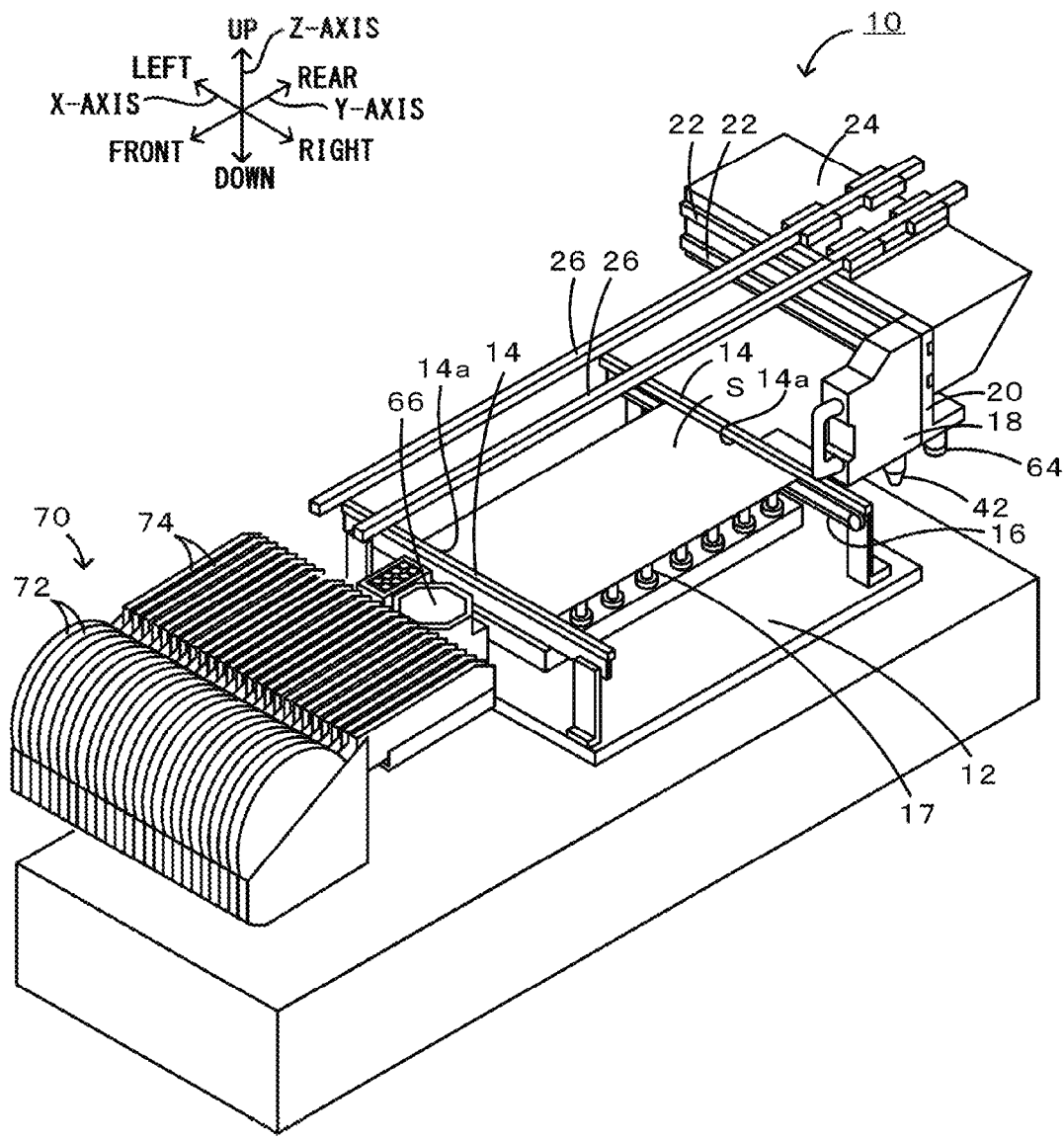
FIG. 1 is a perspective view of a component mounting apparatus 10.
Figure 2:
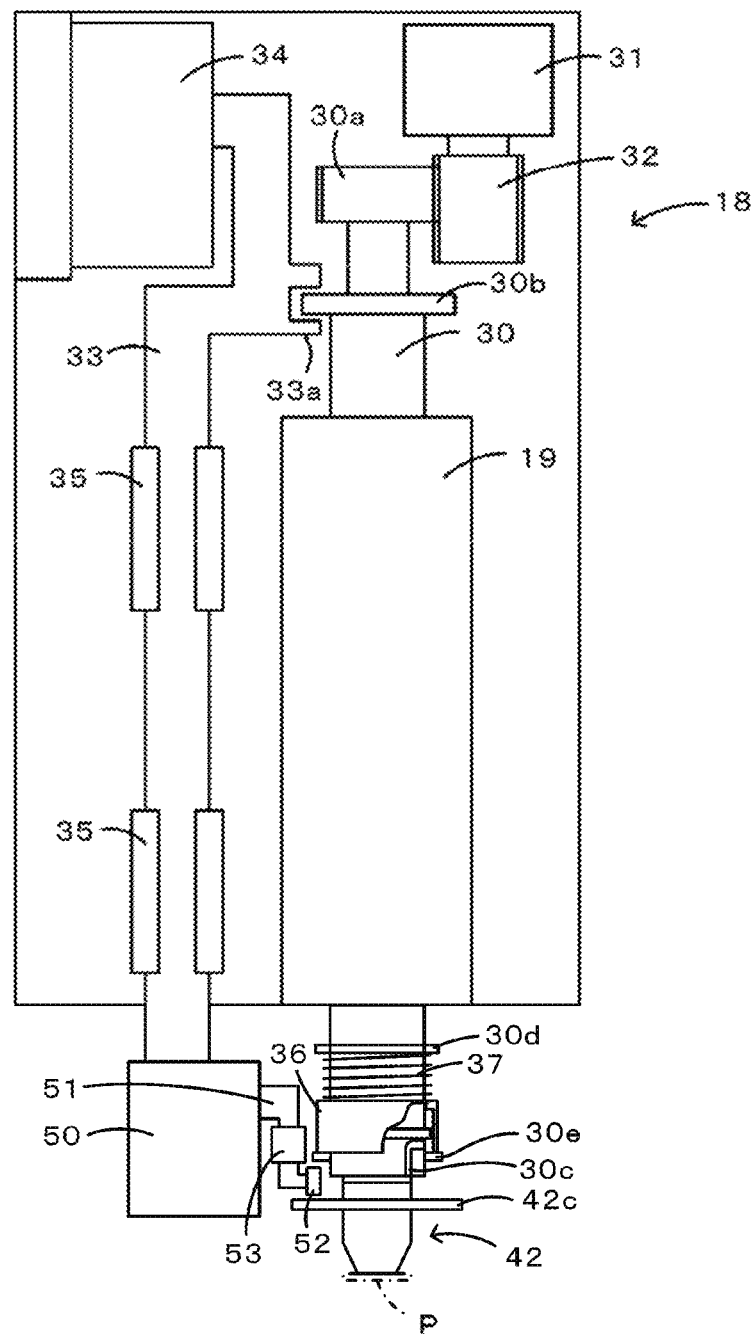
FIG. 2 is an explanatory diagram of a mounting head 18.
Figure 3:
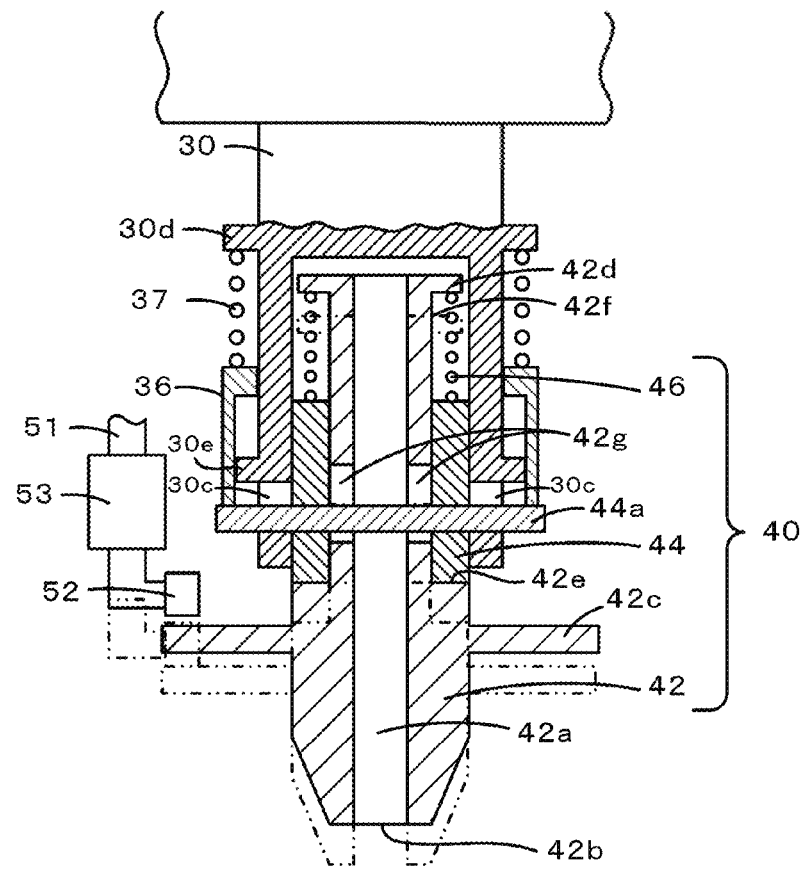
FIG. 3 is a sectional view of a nozzle 42.
Figure 4:
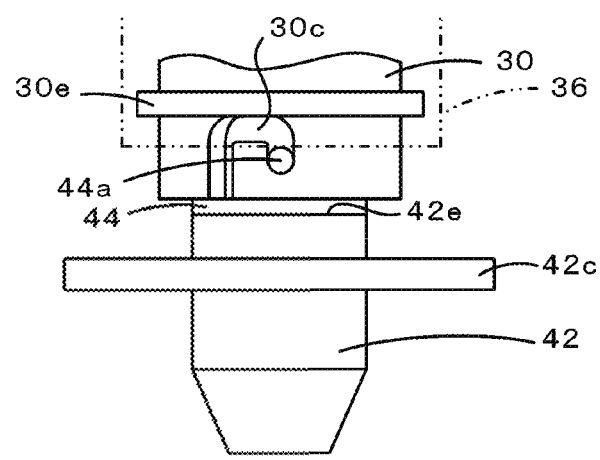
FIG. 4 is an outer appearance explanatory diagram of the nozzle 42.
Figure 5:
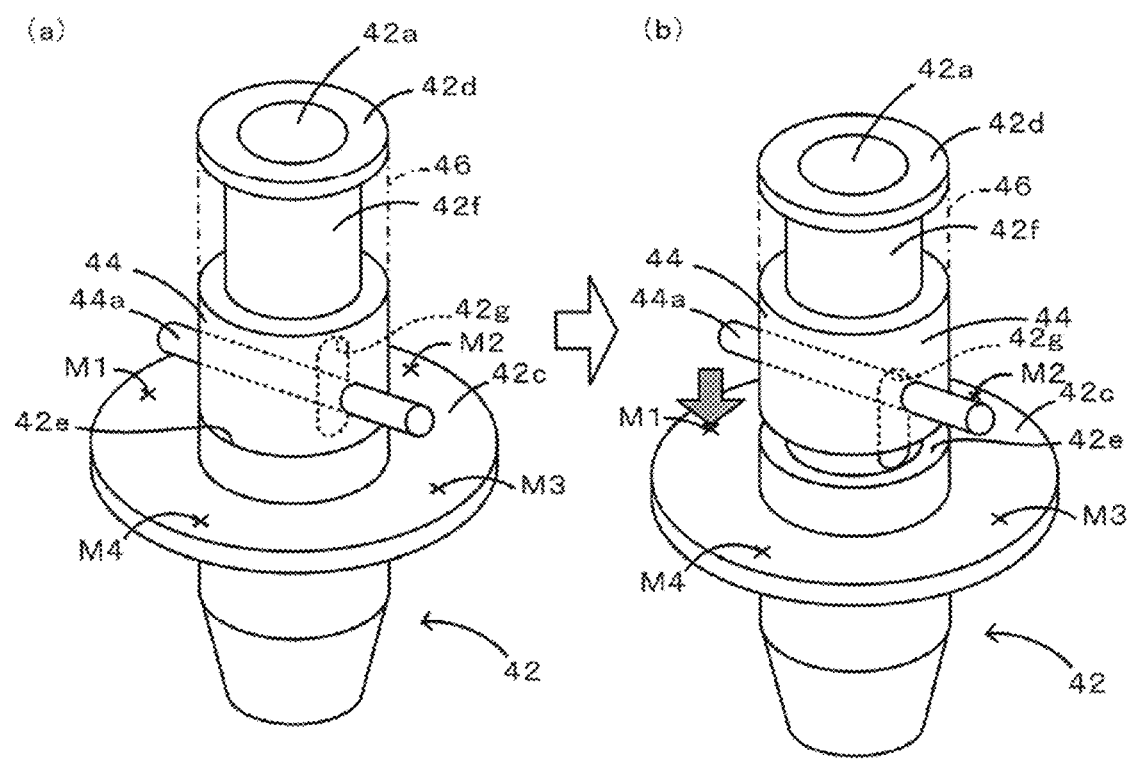
FIG. 5 is an operational explanatory diagram of the nozzle 42.
Figure 6:
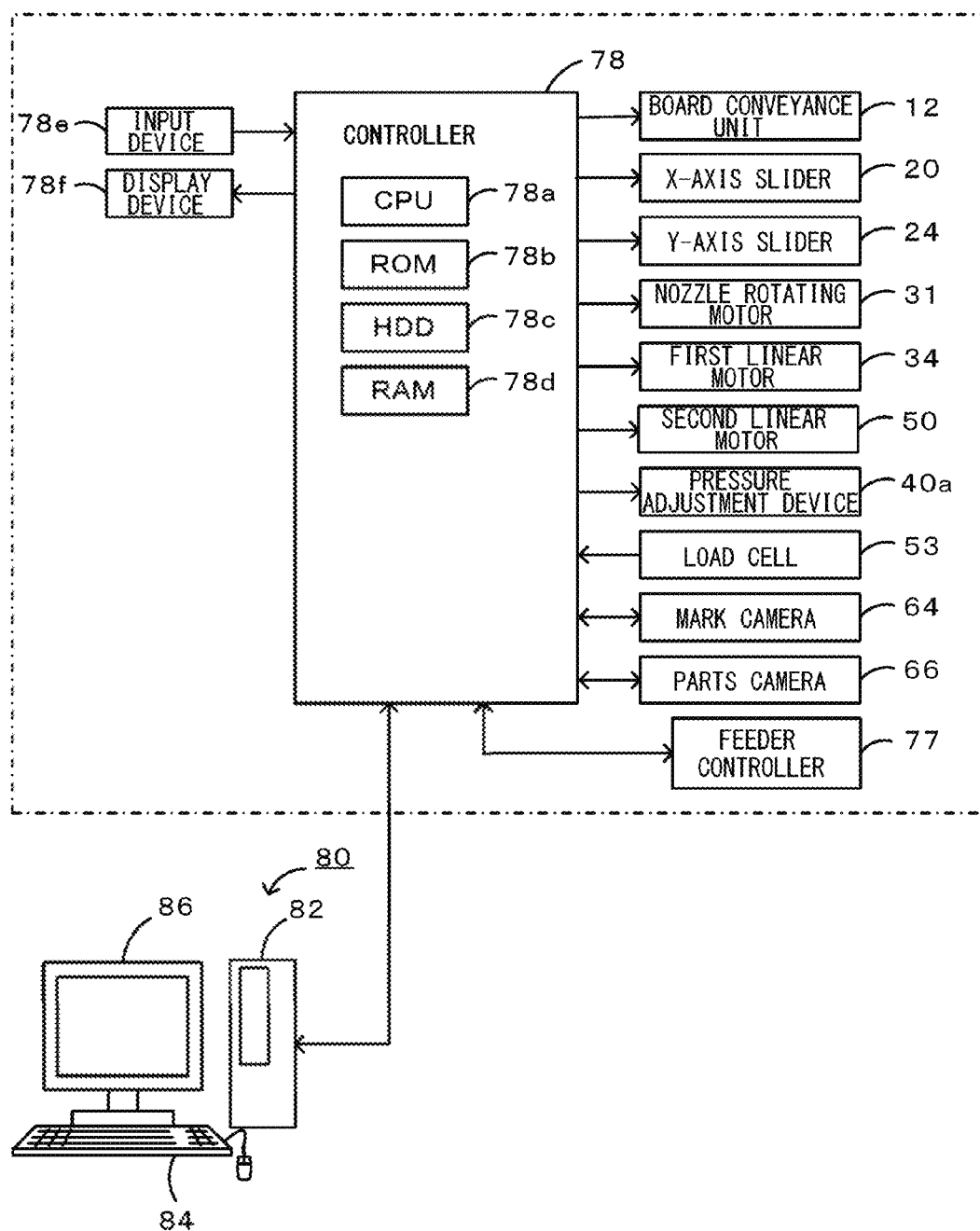
FIG. 6 is an explanatory diagram illustrating electrical connection of a controller 78.

Appropriate embodiments of the present disclosure are described below with reference to the drawings. FIG. 1 is a perspective view of a component mounting apparatus 10, FIG. 2 is an explanatory diagram of a mounting head 18, FIG. 3 is a sectional view of a nozzle 42, FIG. 4 is an outer appearance explanatory diagram of the nozzle 42, FIG. 5 is an operational explanatory diagram of the nozzle 42, and FIG. 6 is an explanatory diagram illustrating electrical connection of a controller 78. Note that, in the present embodiment, a left-right direction (X-axis), a front-rear direction (Y-axis), and an up-down direction (Z-axis) are as indicated in FIG. 1.

As shown in FIG. 1, the component mounting apparatus 10 is provided with a board conveyance unit 12, the mounting head 18, the nozzle 42, a mark camera 64, a parts camera 66, a component supply unit 70, and a controller 78 that executes various control (refer to FIG. 6).

The board conveyance unit 12 conveys a board S from left to right using conveyor belts 16 and 16 (only one side is illustrated in FIG. 1) which are respectively attached to a front and rear pair of support plates 14 and 14. In addition, the board conveyance unit 12 fixes the board S by lifting up the board S from below using a support pin 17 that is disposed below the board S and pressing against roof sections 14a and 14a of the support plates 14 and 14, and releases fixing of the board S by lowering the support pin 17.

The mounting head 18 is movable the XY-plane. Specifically, in the mounting head 18, an X-axis slider 20 moves in the left-right direction accompanying movement in the left-right direction along guide rails 22 and 22, and a Y-axis slider 24 moves in the front-rear direction accompanying movement in the front-rear direction along guide rails 26 and 26. As shown in FIG. 2, the mounting head 18 has a support cylinder 19 that supports a nozzle holder 30 on a revolving shaft and is movable up and down. The nozzle holder 30 is a member that extends in the up-down direction, has a rotation transmission gear 30a and a flange 30b on an upper portion, and holds the nozzle 42 on a lower portion. The rotation transmission gear 30a meshes with a driving gear 32 of a nozzle rotating motor 31. Therefore, when the nozzle rotating motor 31 rotates, the nozzle holder 30 axially rotates accompanying the rotation of the motor. A flange 30b is interposed between an upper side and a lower side of a first engaging section 33a that is provided on a first arm 33 which extends in the up-down direction. The first arm 33 is connected to a movable element of a first linear motor 34. A stator of the first linear motor 34 is fixed to the mounting head 18. Therefore, when the movable element of the first linear motor 34 moves up and down, accompanying the movement, the first arm 33 moves up and down along the guide member 35 that guides movement in the up-down direction and simultaneously, the flange 30b that is interposed in the first engaging section 33a, and thus, the nozzle holder 30 move up and down. A pair of reverse J shape guiding grooves 30c (refer to FIG. 4) is provided at positions that face each other on the lower end side face of the nozzle holder 30. As shown in FIGS. 2 and 3, an upper annular protrusion 30d and a lower annular protrusion 30e are provided with a gap therebetween on the side face of the nozzle holder 30. A lock sleeve 36 covers the nozzle holder 30. A diameter of an upper opening of the lock sleeve 36 is smaller than the diameter of the upper annular protrusion 30d and the lower annular protrusion 30e of the nozzle holder 30, therefore the lock sleeve 36 is movable up and down without falling out from the nozzle holder 30. A lock spring 37 is disposed between the upper end face of the lock sleeve 36 and the upper annular protrusion 30d the nozzle holder 30.

The nozzle 42 sucks a component P to the leading end of the nozzle utilizing pressure, and releases the component P which is sucked by the nozzle tip. As shown in FIGS. 3 and 5, the nozzle 42 is elastically supported via a nozzle spring 46 on the upper end face of the nozzle sleeve 44 that is a nozzle fixing tool. The nozzle 42 has a ventilation passage 42a that extends to the inside in the up-down direction. It is possible to supply negative pressure and positive pressure in the ventilation passage 42a. The nozzle 42 has a flange 42c that horizontally overhangs from a position that is slightly above a suction port 42b that sucks the component P, a spring receiving section 42d that horizontally overhangs from the upper end, and a step surface 42e that is provided in the middle from the upper end up to the flange 42c. There is a small diameter shaft section 42f between the step surface 42e up to the spring receiving section 42d out of the nozzle 42. A pair of long holes 42g that extend in the up-down direction are provided facing each other on the side face of the shaft section 42f. The nozzle sleeve 44 is mounted on the nozzle 42 so as to be able to relatively move up and down with respect to the shaft section 42f of the nozzle 42. The nozzle sleeve 44 is integrated with a pin 44a that passes through in a diametrical direction. The pin 44a is inserted into a pair of long holes 42g of the nozzle 42. Therefore, the nozzle 42 is slidable in a direction in which the long hole 42g extends with respect to the pin 44a, that is, the up-down direction. The nozzle spring 46 is disposed between the upper end face of the nozzle sleeve 44 and the spring receiving section 42d of the nozzle 42.

The nozzle sleeve 44 is fixed to be attachable to and detachable from the guiding grooves 30c of the nozzle holder 30 in a state in which the nozzle 42 is elastically supported. The pin 44a that is provided in the nozzle sleeve 44 is fixed in a state of being interposed between the tail end of the guiding groove 30c and the lower end of the lock sleeve 36 that is biased downward using the lock spring 37. First, the pin 44a of the nozzle sleeve 44 is caused to move in the upward direction along the guiding groove 30c (refer to FIG. 4) of the nozzle holder 30 when the nozzle sleeve 44 that elastically supports the nozzle 42 is fixed to the nozzle holder 30. By doing this, the pin 44a hits the lower end of the lock sleeve 36. After that, the nozzle 42 is rotated along with the nozzle sleeve 44 with respect to the lock sleeve 36 such that the pin 44a is inserted along the guiding groove 30c while the lock sleeve 36 is lifted up using the pin 44a against the elastic force of the lock spring 37. By doing this, the pin 44a moves in the downward direction to the end through a horizontal portion of the guiding groove 30c reaching the tail end of the guiding groove 30c. At this time, the pin 44a is in a state of being pressed at the tail end of the guiding groove 30c by the lock sleeve 36 that is biased downward using the lock spring 37. As a result, the nozzle sleeve 44 is locked to the nozzle holder 30 via the pin 44a. Note that, when the nozzle sleeve 44 that elastically supports the nozzle 42 is removed from the nozzle holder 30, a procedure opposite to a fixing procedure may be performed.

Returning to FIG. 2, a stator of a second linear motor 50 is fixed to the lower end of the first arm 33. A second arm 51 is connected to a movable element of the second linear motor 50. The second arm 51 is provided with a second engaging section 52 that includes a cam follower on the arm tip end and is provided with a load cell 53 that detects a load between arms. The second engaging section 52 is disposed at a position that faces the upper face of a flange 42c of the nozzle 42. When the movable element of the second linear motor 50 moves downward, accompanying the movement, the second engaging section 52 of the second arm 51 pressurizes the flange 42c downward against the elastic force of the nozzle spring 46, therefore the nozzle 42 moves downward with respect to the pin 44a of the nozzle sleeve 44, that is, the nozzle holder 30 (refer to the two-dot chain line in FIG. 3). After that, when the movable element of the second linear motor 50 moves upward, the force that pressurizes the flange 42c downward weakens, therefore the nozzle 42 moves upward with respect to the pin 44a, that is, the nozzle holder 30 due to elastic force of the nozzle spring 46.

Returning to FIG. 1, the mark camera 64 is installed on the lower end of the X-axis slider 20 such that the imaging direction is orientated facing the board S, and is movable accompanying movement of the mounting head 18. The mark camera 64 images the board positional alignment fiducial mark, which is not shown in the drawings, that is provided on the board S and outputs the obtained image to the controller 78.

The parts camera 66 is installed such that the imaging direction is an upper orientation approximately in the center of a length in the left-right direction between the component supply unit 70 and the board conveyance unit 12. The parts camera 66 images the component that is sucked by the nozzle 42 which passes upward, and outputs the image that is obtained by imaging to the controller 78.

The component supply unit 70 is provided with a reel 72 and a feeder 74. A tape that is formed is wound on the reel 72 such that a recessed section in which the component is accommodated is lined up along a longitudinal direction. The feeder 74 feeds out the component of the tape that is wound on the reel 72 to a predetermined component supply position. The tape that is wound on the reel 72 has a film that covers the component, but the film is peeled off when reaching the component supply position. Therefore, the component that is disposed at the component supply position is in a state capable of being sucked by the nozzle 42.

As shown in FIG. 6, the controller 78 is configured as a microprocessor with a CPU 78a as the center, and is provided with a ROM 78b that stores a processing program, an HDD 78c that stores various data, a RAM 78d that is used as a work region, and the like. In addition, an input device 78e such as a mouse or a keyboard and a display device 78f such as a liquid crystal display are connected to the controller 78. The controller 78 is connected to the feeder controller 77 or the management computer 80 that are built in the feeder 74 such that bidirectional communication is possible. In addition, the controller 78 is connected such that it is possible to output a control signal to the board conveyance unit 12, the X-axis slider 20, the Y-axis slider 24, the nozzle rotating motor 31, the first and second linear motors 34 and 50, a pressure adjustment device 43 for the nozzle 42, the mark camera 64, and the parts camera 66. In addition, the controller 78 is connected such that it is possible to receive a detection signal from the load cell 53 and an image signal from the mark camera 64 or the parts camera 66. For example, the controller 78 recognizes a position (coordinates) of the board S by processing an image of the board S that is imaged by the mark camera 64 and recognizing the position of the fiducial mark. In addition, the controller 78 determines whether or not the component is sucked by the nozzle 42 or determines the shape, size, suction position, and the like of the component based on the image that is captured by the parts camera 66.

As shown in FIG. 6, the management computer 80 is provided with a personal computer main body 82, an input device 84, and a display 86, is able to input a signal from the input device 84 that is operated by an operator, and is able to output various images to the display 86. Production job data is stored in a memory of the personal computer main body 82. In the production job data, in each component mounting apparatus 10, in which order components P are mounted on the board S, how many of the boards S that are mounted in such a manner are manufactured, or the like are set.

Figure 7:
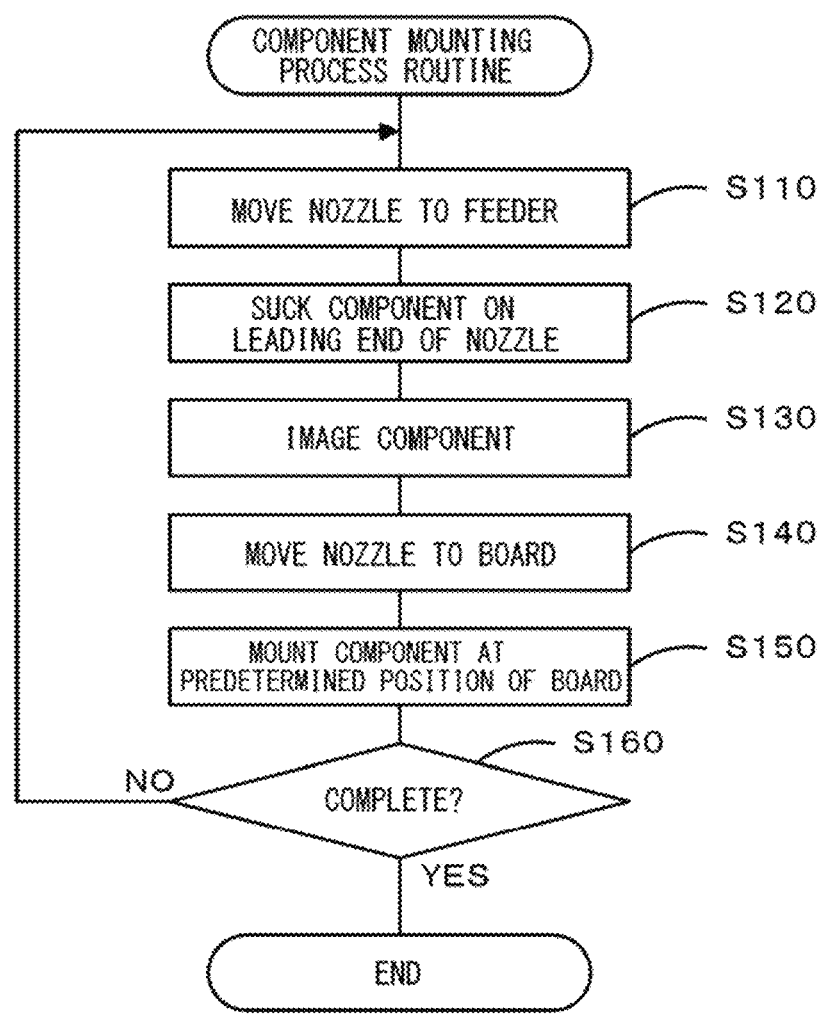
FIG. 7 is a flowchart of a component mounting process routine.

Next, the controller 78 of the component mounting apparatus 10 is described concerning the operation in which the components P are mounted on the board S based on the production job. FIG. 7 is a flowchart of a component mounting process routine. The program of the component mounting process routine is stored in an HDD 78c of the controller 78.

When a CPU 78a of the controller 78 starts the routine, first, the nozzle 42 is moved to the feeder 74 (step S110). Specifically, the CPU 78a moves the nozzle 42 to the component supply position of the feeder 74 that supplies the predetermined component P out of the component supply unit 70 by controlling the X-axis and Y-axis sliders 20 and 24.

Next, the CPU 78a causes the component P to be sucked on the leading end of the nozzle 42 (step S120). Specifically, the CPU 78a moves the nozzle holder 30 downward by lowering the movable element of the first linear motor 34. In parallel with such, the CPU 78a moves the nozzle 42 to the lowermost end with respect to the nozzle holder 30 by lowering the movable element of the second linear motor 50 before the leading end of the nozzle 42 abuts with the component P. After that, when the CPU 78a determines that the leading end of the nozzle 42 contacts the component P based on the detection signal from the load cell 53, the CPU 78a raises the movable element of the second linear motor 50 such that the reaction force is equal to set pressing force. Thereby, it is possible for the component P not to receive damage by the nozzle 42. In addition, the CPU 78a controls the pressure adjustment device 43 such that negative pressure is supplied to the suction port 42b at a point of time at which the leading end of the nozzle 42 abuts with the component P. Thereby, the component P is sucked on the leading end of the nozzle 42.

Next, the CPU 78a images the component P by the parts camera 66 (step S130). Specifically, the CPU 78a controls the second linear motor 50 such that the second engaging section 52 of the second arm 51 is separated above the flange 42c and controls the first linear motor 34 such that the component P is a predetermined height. In parallel with such, the CPU 78a controls the X-axis and Y-axis sliders 20 and 24 such that the center position of the nozzle 42 matches a reference point that is determined in advance of an imaging region of the parts camera 66, and images the component P by the parts camera 66 at a point in time at which the center position of the nozzle 42 matches the reference point. The CPU 78a grips the position of the component P with respect to the reference point by analyzing the captured image.

Next, the CPU 78a moves the nozzle 42 on the board S (step S140). Specifically, the CPU 78a moves the nozzle 42 above the predetermined position at which the component P is mounted out of the board S by controlling the X-axis and Y-axis sliders 20 and 24.

Next, the CPU 78a mounts the component P on the predetermined position of the board S (step S150). Specifically, the CPU 78a controls the nozzle rotating motor 31 such that a posture of the component P has a predetermined posture that is set in advance based on the captured image. In addition, the CPU 78a moves the nozzle holder 30 downward by lowering the movable element of the first linear motor 34. In parallel with such, the CPU 78a moves the nozzle 42 to the lowermost end with respect to the nozzle holder 30 by lowering the movable element of the second linear motor 50 before the component P that is sucked by the leading end of the nozzle 42 abuts with the board S. After that, when the CPU 78a determines that the component P contacts the board S based on the detection signal from the load cell 53, the CPU 78a raises the movable element of the second linear motor 50 such that the reaction force is equal to set pressing force. Thereby, it is possible for the component P not to receive damage by an impact with the board S. In addition, the CPU 78a controls the pressure adjustment device 43 such that positive pressure is supplied to the leading end of the nozzle 42 at a point of time at which the component P abuts with the board S. Thereby, the component P is mounted at the predetermined position of the board S.

Next, the CPU 78a determines whether or not mounting of the component that is to be mounted on the board S is complete (step S160), and if the mounting is not complete, the processes of step S110 and thereafter are executed on a subsequent component P, and if the mounting is complete, the present routine ends.

Figure 8:
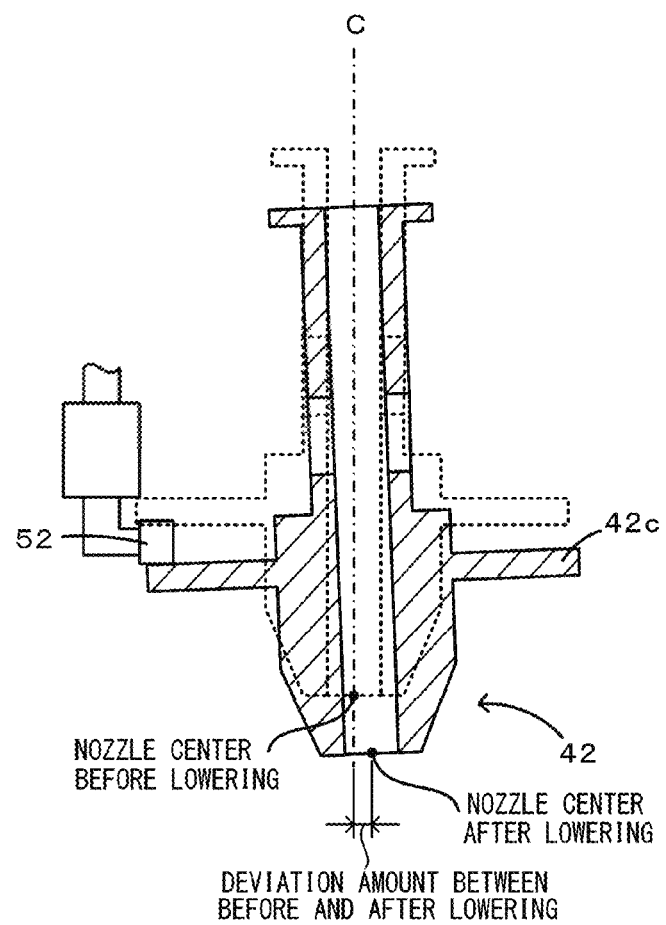
FIG. 8 is a sectional view when the nozzle 42 is deviated from a central axis C and is diagonally lowered.

Note that, in a case where the movable element of the second linear motor 50 lowers and the second engaging section 52 of the second arm 51 presses down the flange 42c of the nozzle 42, a moment of force is generated since the second engaging section 52 presses down the position that is offset from the central axis C of the nozzle 42. As a result, as shown in FIG. 8, it is often the case that the nozzle 42 is deviated from the central axis C and lowered diagonally without lowering along the central axis C. In addition, the nozzle 42 is supported by the pin 44a that extends in the diametrical direction. In this case, it is often the case that the deviation amount when the position on an extension line of the pin 44a out of the flange 42c is pressed down by the second engaging section 52 and the deviation amount of another position do not match.

Therefore, the CPU 78a controls the X-axis and the Y-axis sliders 20 and 24 such that the nozzle 42 comes above the parts camera 66 each time the nozzle 42 is exchanged, measures the deviation amount between before and after lowering, and stores the deviation amount in the HDD 78c. That is, the CPU 78a measures the deviation amount (deviation amount between before and after lowering) between the center position of the nozzle 42 in the image that is captured before pressing down the flange 42c using the second engaging section 52 and the center position of the nozzle 42 in the image that is captured after pressing down on the XY-coordinates. Note that, preferably, in the imaging order, first, the state is imaged after the flange 42c is pressed down and thereafter the state is imaged in which the flange 42c is not pressed down. When the deviation amount between before and after lowering is determined, as shown in FIG. 5, the CPU 78a sets the measurement position on the flange 42c on a line corresponding to a line along which the pin 44a extends as a reference position M1. Then, the CPU 78a measures the deviation amount between before and after lowering at the reference position M1 and the measured deviation amount is stored in the HDD 78c as the deviation amount with an angle of 0°. Next, the deviation amounts between before and after lowering are measured at each measurement position M2, M3, and M4 by sequentially rotating at 90°, 180°, and 270° in a predetermined direction about the central axis of the nozzle 42, and stores the deviation amounts in the HDD 78c as deviation amounts of angles of 90°, 180°, and 270°.

In a case where the nozzle 42 sucks the component P, even if the nozzle 42 is moved to XY-coordinates set in advance such that the center of the nozzle 42 matches the center of the component P, there are times when the center of the nozzle 42 does not match the center of the component P for some reason (for example, tolerance and the like during manufacture of the mounting head). A correction amount for causing the centers to match is a pickup offset amount, and the pickup offset amount when the deviation amount between before and after lowering of the nozzle 42 is zero is a pickup offset basic amount. In a case where the deviation amount between before and after lowering of the nozzle 42 is not zero, it is necessary to take into account the deviation amount in the pickup offset basic amount. The correction value at that time is pickup offset basic amount +deviation amount between before and after lowering. The pickup offset basic amount maybe obtained using the component mounting apparatus 10 with the deviation amount between before and after lowering at zero, and the pickup offset amount may be measured using the component mounting apparatus 10 with a known deviation amount between before and after lowering and therefrom setting the value obtained by subtracting the deviation amount between before and after lowering. The CPU 78a executes positional control of XY-coordinates such that the center of the nozzle 42 matches the center of the component P by taking the deviation amount between before and after lowering into account in step S120 of the component mounting process routine. When considering the deviation amount between before and after lowering, in practice, the CPU 78a recognizes several times the position at which the flange 42c is pressed down by the second engaging section 52 about the central axis of the nozzle from the reference position, and reads from the HDD 78c the deviation amount of the closest angle to the angle of the position and uses the result to correct.

In addition, in a case where the nozzle 42 that sucks the component P mounts the component P at the predetermined position of the board S, even if the nozzle 42 is moved to the XY-coordinates that are set in advance such that the component P is accurately mounted at the predetermined position, there are times when the component P is not accurately mounted at the predetermined position for some reason. A correction amount for causing the centers to match is called a mounting deviation amount, and a mounting deviation amount when the deviation amount between before and after lowering of the nozzle 42 is zero is called a mounting deviation basic amount. In a case where the deviation amount between before and after lowering of the nozzle 42 is not zero, it is necessary to take into account the deviation amount in the mounting deviation basic amount. The correction amount at that time is mounting deviation basic amount+deviation amount between before and after lowering. The mounting deviation basic amount may be obtained using the component mounting apparatus 10 with the deviation amount between before and after lowering at zero, and the mounting deviation amount may be measured using the component mounting apparatus 10 with a known deviation amount between before and after lowering and therefrom setting the value obtained by subtracting the deviation amount between before and after lowering. The CPU 78a executes positional control of XY-coordinates such that the component P is accurately mounted at the predetermined position of the board S by taking the deviation amount between before and after lowering into account in step S150 of the component mounting process routine. When considering the deviation amount between before and after lowering, in practice, the CPU 78a recognizes several times the position at which the flange 42c is pressed down by the second engaging section 52 about the central axis of the nozzle from the reference position, and reads from the HDD the deviation amount of the closest angle to the angle of the position to correct.

In this arrangement, the correspondence relationship between constituent elements of the present embodiment and constituent elements of the present disclosure is clarified. The nozzle spring 46 of the present embodiment is equivalent to the elastic body of the present embodiment, the flange 42c is equivalent to the protrusion, the second linear motor 50, the second arm 51, and the second engaging section 52 are equivalent to the nozzle lifting and lowering mechanism, and the controller 78 is equivalent to the control device.

The component mounting apparatus 10 described above measures in advance the deviation amount of the tip position of the nozzle 42 between before and after the second engaging section 52 moves the nozzle 42 downward with respect to the nozzle holder 30, and controls the mounting head 18 so as to suck the component P and mount the component P on the board S taking the deviation amount into account. Therefore, it is possible to increase suction position accuracy and mounting position accuracy in a case where the position that is offset from the central axis of the nozzle 42 is pressed down and the component P is sucked by the nozzle leading end and the component P that is sucked by the nozzle tip is mounted on the board S.

In addition, since the controller 78 measures the deviation amount between before and after lowering each time the nozzle 42 is exchanged, even if the nozzle 42 is exchanged with a different nozzle 42, the controller 78 controls the mounting head 18 so as to suck the component P and mount the component P on the board S taking the deviation amount into account matching the nozzle 42 after the exchange. Therefore, it is possible to increase suction position accuracy and mounting position accuracy after the exchange of the nozzle 42.

Furthermore, even if the deviation amounts between before and after lowering with a different moment of force that is generated in the nozzle 42 are varied according to the angle from the reference position to the position at which the second engaging section 52 presses down the flange 42c, it is possible for the controller 78 to take into account an appropriate deviation amount according to the angle. In particular, it is often the case that the deviation amount of the position on the extension line of the pin 44a out of the flange 42c and the deviation amount of another position do not match, but even in such a case, it is possible to increase accuracy of control in order to determine the appropriate deviation amount according to the angle from the reference position M1 to a position at which the second engaging section 52 presses down the flange 42c.

Note that, needless to say, the present disclosure is not limited to the embodiments described above, and it is possible to execute various forms within the technical scope of the present disclosure.

Figure 9:
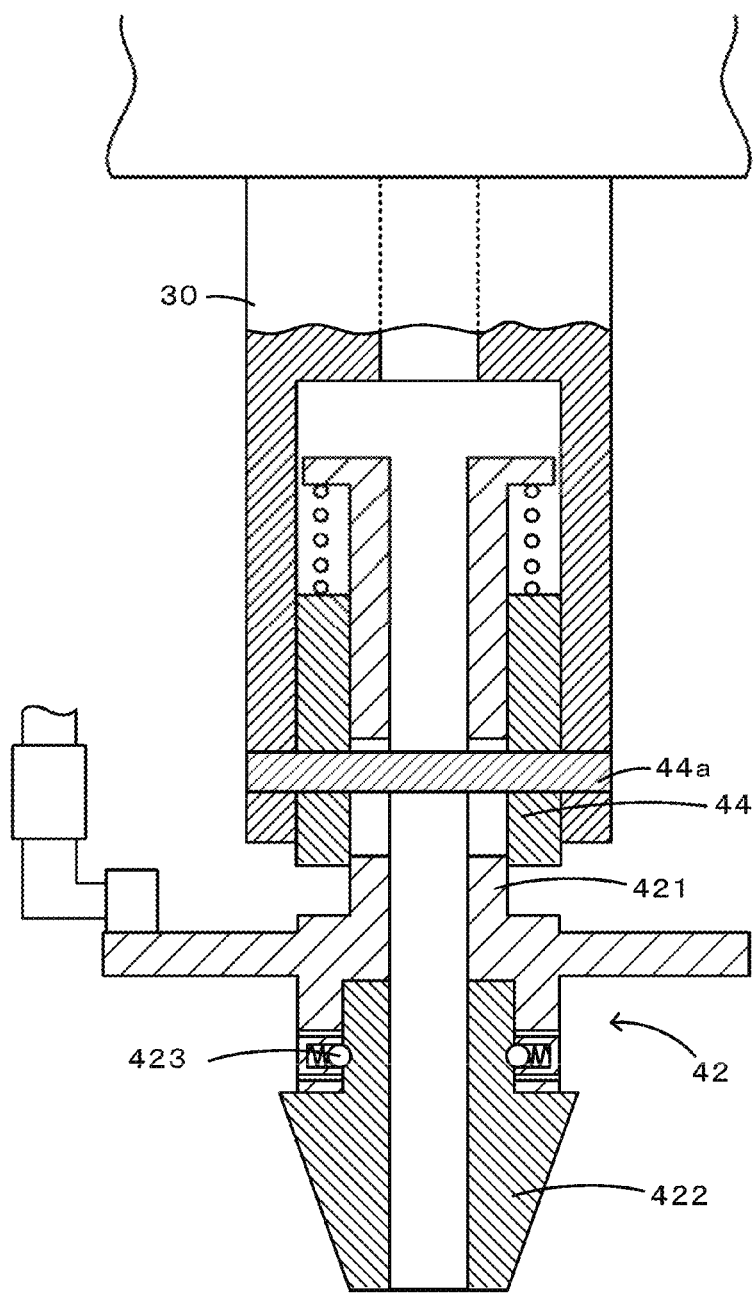
FIG. 9 is a sectional view of a nozzle 42 of another embodiment.

For example, in the embodiment described above, when the nozzle 42 is exchanged, exchanging the nozzle 42 along with the nozzle sleeve 44 from the nozzle holder 30 is described, but exchange is not particularly limited thereto. For example, as shown in FIG. 9, the nozzle sleeve 44 that is provided with the pin 44a is unremovably fixed to the lower end of the nozzle holder 30, the nozzle 42 includes a nozzle main body 421 and a tip member 422, and the tip member 422 is removed from the nozzle main body 421. In this arrangement, for example, the tip member 422 is removably supported by a ball plunger 423 that is attached to the nozzle main body 421, but for example, maybe removably supported with screws in place of the ball plunger 423. In FIG. 9, the CPU 78a may measure the deviation amount between before and after lowering each time the tip member 422 of the nozzle 42 is exchanged. By doing so, the same effect is obtained as the embodiment described above.

In the embodiment described above, an example is indicated in which positional control of the XY-coordinates is performed taking the deviation amount between before and after lowering into account in the pickup offset basic amount and the mounting deviation basic amount, but the deviation amount between before and after lowering may be taken into account in another correction value. For example, the data amount in which the deviation amount between before and after lowering is zero may be set as the basic amount concerning various calibration data, and the control may be performed by taking the deviation amount between before and after lowering into account in the basic amount.

In the embodiment described above, the deviation amount between before and after lowering is measured at 90° from the reference position M1 (angle 0°), but is not particularly limited thereto, but for example, may be measured at the predetermined angle (60°, 45°, 30°, 20°, or the like) from the reference position M1. In addition, in a case where the deviation amount between before and after lowering is not dependent on the angle, the deviation amount between before and after lowering may be measured at any one point.

In the embodiment described above, an example is indicated provided with only one nozzle holder 30 that removably holds the nozzle 42 as the mounting head 18, but a plurality of such nozzle holders 30 may be provided at equal angular intervals in a range of rotor with the up and down axis as the center of rotation. For a specific configuration, refer to FIG. 6 in PTL 1 (WO 2014/080472). Even in such a configuration, when the deviation amount between before and after lowering is measured in each nozzle and the mounting head is so controlled that the mounting head sucks and mounts the component on the board taking the deviation amount into account, the same effects are obtained as in the embodiment described above.

In the embodiment described above, the deviation amount between before and after lowering is measured during exchange of the nozzle 42, but the measurement period is not particularly limited to during exchange of the nozzle 42. For example, such a deviation amount may be measured at a production start time and such deviation amount may be measured regularly. In any case, it is possible to increase suction position accuracy and mounting position accuracy of the nozzle 42 if the mounting head 18 is controlled so as to suck the component P and mount the component P on the board S taking the deviation amount into account of the nozzle 42 after measurement.

INDUSTRIAL APPLICABILITY

The present disclosure is able to be used in a component mounting apparatus, a component mounting system that is combined with a component mounting apparatus, or the like.

REFERENCE SIGNS LIST

10: component mounting apparatus, 12: board conveyance unit, 14: support plate, 14a : roof section, 16: conveyor belt, 17: support pin, 18: mounting head, 19: support cylinder, 20: x-axis slider, 22: guide rail, 24: y-axis slider, 26: guide rail, 30: nozzle holder, 30a: rotation transmission gear, 30b: flange, 30c: guiding groove, 30d: upper annular protrusion, 30e: lower annular protrusion, 31: nozzle rotating motor, 32: driving gear, 33: first arm, 33a: first engaging section, 34: first linear motor, 35: guide member, 36: lock sleeve, 37: lock spring, 42: nozzle, 42: ventilation passage, 42a: ventilation passage, 42b: suction port, 42c: flange, 42d: spring receiving section, 42e: step surface, 42f: shaft section, 42g: long hole, 43: pressure adjustment device, 44: nozzle sleeve, 44a: pin, 46: nozzle spring, 50: second linear motor, 51: second arm, 52: second engaging section, 53: load cell, 60: reel, 64: mark camera, 66: parts camera, 70: component supply unit, 72: reel, 74: feeder, 77: feeder controller, 78: controller, 78a: CPU, 78b: ROM, 78c: HDD, 78d: RAM, 78e: input device, 78f: display device, 80: management computer, 82: personal computer main body, 84: input device, 86: display, 421: nozzle main body, 422: tip member, 423: ball plunger

The invention claimed is:

1. A component mounting apparatus comprising:
a mounting head, including
   a nozzle holder that extends in an up-down direction, the nozzle holder including a pin that is bridged to the lower end of the nozzle holder in a diametrical direction of the nozzle holder,
   a nozzle that is attached to a lower end of the nozzle holder to be movable up and down with respect to the nozzle holder,
   an elastic body that elastically supports the nozzle,
   a protrusion that is provided at a position that is offset from the central axis of the nozzle, and
   a nozzle lifting and lowering mechanism that is able to move the nozzle downward by engaging with the protrusion and pressing down the protrusion against elastic force of the elastic body; and
a control device that controls the mounting head, the control device configured to
   measure in advance a deviation amount between a tip position of the nozzle before the nozzle lifting and lowering mechanism moves the nozzle downward and a tip position of the nozzle after the nozzle lifting and lowering mechanism moves the nozzle downward when the nozzle lifting and lowering mechanism presses down a predetermined reference position of the protrusion,
   set a position on the protrusion on a line corresponding to a line along which the pin extends as the reference position, and
   control the mounting head so as to suck a component to mount the component on a board taking the deviation amount into account.

2. The component mounting apparatus according to claim 1,
wherein the control device measures the deviation amount each time the nozzle is exchanged.

3. The component mounting apparatus according to claim 1,
wherein the control device measures in advance the deviation amount in a case where the nozzle lifting and lowering mechanism presses down the predetermined reference position of the protrusion and a case where the nozzle lifting and lowering mechanism presses down one or more rotation angle positions that are different from the reference position, determines the deviation amount according to an angle from the reference position to a position at which the protrusion is pressed down by the nozzle lifting and lowering mechanism when the nozzle actually sucks or mounts the component from the measured deviation amounts, and controls the mounting head so as to suck the component to mount the component on the board taking the determined deviation amount into account.

4. The component mounting apparatus according to claim 3,
the nozzle has a pair of guide sections formed of a long groove or a long hole that extends in the up-down direction, and
the pin passes through the pair of guide sections and guides movement of the nozzle in the up-down direction.

5. The component mounting apparatus according to claim 1, wherein
the predetermined reference position is a first predetermined reference position, the control device measures in advance the deviation amount at plural predetermined reference positions by sequentially rotating the nozzle from the first predetermined reference position around the central axis at plural predetermined angles, and the control device controls the mounting head so as to suck a component to mount the component on the board based on one of the plural reference positions associated with a predetermined angle of the plural predetermined angles closest a position on the protrusion that is pressed down by the nozzle lifting and lowering mechanism.

\* \* \* \* \*